United States Patent [19]

Richman

[11] Patent Number: 4,994,991

[45] Date of Patent: Feb. 19, 1991

[54] DIGITAL SYNCHRONOUS DETECTOR SAMPLING

[75] Inventor: Isaac Richman, Newport Beach, Calif.

[73] Assignee: McDonnell Douglas Corporation, Long Beach, Calif.

[21] Appl. No.: 292,456

[22] Filed: Dec. 30, 1988

[51] Int. Cl.$^5$ .............................................. G06G 7/12
[52] U.S. Cl. .................................... 364/581; 364/576; 364/574; 250/231.14; 250/237 G
[58] Field of Search .............. 364/576, 569, 565, 486, 364/574, 572, 481, 726, 733, 581, 431.07, 725, 553, 484, 724.01; 341/122; 73/DIG. 11; 377/19, 53; 375/58; 318/640, 685, 696; 356/27, 28, 429; 350/273, 274; 250/231 SE, 237 G

[56] References Cited

U.S. PATENT DOCUMENTS

| 4,658,132 | 4/1987 | Nishiura et al. | 250/237 G |
| 4,658,133 | 4/1987 | Nishiura | 250/237 G |
| 4,713,782 | 12/1987 | Blackham | 364/726 |
| 4,786,861 | 11/1988 | Hulsing, II et al. | 377/19 |
| 4,807,146 | 2/1989 | Goodrich et al. | 364/481 |

OTHER PUBLICATIONS

E. N. Kotlikov et al., "Digital Synchronous Detector," Instruments and Experimental Techniques, vol. 23, No. 3, May–Jun. 1980, pp. 683–685.
"Explore the Lock–In Amplifier," Princeton Applied Research, Technical Note 15; copyright 1976.
J. R. Ragazzin and G. F. Franklin, "Sampled-Data Control Systems," McGraw HillBook Co., Inc., 1958, pp. 12–28.
C. C. Chen and C. S. Gardner, "Performance of PLL Synchronized Optical PPM Communication Systems," IEEE Trans. Commun., vol. COM-34, No. 10, Oct. 1986, pp. 988–994.
W. A. Gardner, "The Role of Spectral Correlation in Design and Performance Analysis of Synchronizers," IEEE Trans. Commun., vol. COM-34, No. 11, Nov. 1986, pp. 1089–1095.
G. W. Small and K. E. Leslie, "Synthesizing Signal Generator for Use with Lock-In Amplifiers in Audio-frequency Measurements," IEEE TRans. Instrument & Measurement, vol. IM-35, No. 3, Sep. 1986, pp. 249–255.
C. N. Georghiades, "Joint Baud and Frame Synchronization in Direct Detection Optical Communications," IEEE Trans. Acoust., Speech, Signal Processing, vol. COM-33, No. 4, Dec. 1982, pp. 937–942.
R. J. Marks, II, "Restoration of Continuously Sampled Band-Limited Signals from Aliased Data," IEEE Trans. Acoust., Speech, Signal Processing, vol. AS-SP-30, No. 5, Dec. 1982, pp. 937–982.
C. M. Radar, "Recovery of Undersampled Periodic Waveforms," IEEE Trans. Acoust., Speech, Signal Processing, vol. ASSP-25, No. 3, Jun. 1977, pp. 242–249.
M. H. Hayes, J. S. Lim and A. V. Oppenheim, "Signal Reconstruction from Phase or Magnitude," IEEE Trans. Acoust., Speech, Signal Processing, vol. AS-SP-28, No. 6, Dec. 1980, pp 672–680.
S. H. Nawab, T. F. Quatieri and J. S. Lim, "Signal Reconstruction from Short-Time Fourier Transforms Magnitude," IEEE Trans. Acoust., Speech, Signal Processing, vol, ASSP-31, No. 4, Aug. 1983, pp. 986–998.
R. W. Schafer and L. R. Rabiner, "A Digital Signal Processing Approach to Interpolation", Proc. IEEE, vol. 61, No. 6, Jun. 1973, p. 692–702.
R. J. Marks, II, "Differintegral Interpolation from a Bandlimited Signal's Samples," IEEE Trans. Acoust., Speech, Signal Processing, vol. ASSP-29, No. 4, Aug. 1981, pp. 872–876.

*Primary Examiner*—Parshotam S. Lall
*Assistant Examiner*—Michael Zanelli
*Attorney, Agent, or Firm*—Curt L. Harrington; Gregory A. Cone; John P. Scholl

[57] ABSTRACT

Disclosed is an apparatus and method for the measurement of weak signals in an output device, including weak signals in the presence of obscuring noise, by pseudorandom sampling of a repetitive alternating potential waveform and digitally extracting the fundamental hormonic to reconstruct an accurate transfer function for the device being measured.

11 Claims, 4 Drawing Sheets

DIGITAL SYNCHRONOUS DETECTOR SAMPLING

BACKGROUND OF THE INVENTION

One of the problems in the electronic components field involves the measurement of weak signal components produced by an electronic device in the presence of obscuring background noise. A large signal input into a device will normally override the noise component in a given device. With a small signal input, the background noise, inherent in the testing and measurement process, can totally block detection of the signal transmitted through the device. Once the signal which the device is intended to produce attains a lesser magnitude than the noise existing in the test system, the signal appears not to exist.

In a general sense, noise and interference are used to describe any unwanted or undesirable signals in communication channels and systems. Since in many cases these signals are random or unpredictable, the characteristics of random processes can be used to defeat noise effects. Since random noise can have both a positive and negative effect upon a system, it may be expected that the magnitude and occurrence of the positive effects equal the magnitude and occurrence of the negative effects, causing the net effect of the noise to disappear. Once the magnitude of the signal to be detected falls beneath the magnitude of the randomly occurring noise, the problem of separating the signal from the noise must be solved in order to see how well the device handles the small signal in a test or to acquire the desired signal in an application.

The transfer function characterizes an electronic unit; with it the output resulting from a specified input may be computed. Usually, the transfer function of an ideal device is a mathematical operator which operates on a given input to produce an output proportional to that input. For real devices, unfortunately, the transfer function can change with respect to the intensity of the input signal. The transfer function must be determined over the full range of useful input amplitudes. To further complicate matters, small input amplitudes and the correspondingly small output amplitudes they produce are often enveloped in surrounding noise. This noise is characteristic of almost any electronic environment. Where the output signal is buried in noise, it is extremely difficult to discern the output, due to a controlled input, from the noise. In consideration of both these purposes, namely, the characterization of transfer function and the measurement of the small signal output in the presence of noise, it is desirable to be able to test a particular device for faithful operation under small signal conditions and to test large numbers of devices to find the characteristic transfer function under conditions of changing input signal strength. This is especially useful for oPtical and other devices in which nonlinearities often occur.

One solution to this problem has been the use of the lock-in amplifier. Commercially available lock-in amplifiers can measure weak input components in the presence of obscuring background noise, but the operating frequency range is generally limited to from 0.1 hertz to 200,000 hertz. The output of the lock-in amplifier is a phase-sensitive direct voltage which is proportional to the input signal. Basically, the lock-in amplifier detects weak signals by the process of synchronous demodulation. Extraneous signals which are not synchronized to the reference are rejected.

Lock-in amplifiers usually have a low-noise pre-amplifier and a post-amplifier, with a filter sandwiched in between. This filter, often referred to as a pre-detection filter, is for the purpose of reducing the possibility that the lock-in amplifier will overload during severe noise conditions. Pre-filtering can distort the signal sought to be measured, depending upon the frequency characteristics of the input signal and the frequency characteristics of the pre-filter. It is recognized that the pre-filter also has a transfer function which, in effect, "couples" with the transfer function of the device sought to be measured. For example, since pre-filtering is for the purpose of eliminating the higher harmonics of the fundamental carrier frequency, if the transfer functions of the device to be measured are to operate on the higher frequencies as well, the high frequency portion of the output will be attenuated. This would have the effect of masking the very distortions which are attempted to be measured.

Also, since filters are frequency specific, when the signal frequency is changed, the frequency of the pre-filter and the lock-in amplifier must be changed. Also, since a lock-in amplifier is an analog device, time must be expended during a test to allow sufficient time for the lock-in amplifier to stabilize. This limitation severely extends the total time required for making measurements.

Furthermore, lock-in amplifiers are bulky and expensive. If several parallel measurements of the same type are to be made on a single multi-channel device, one such lock-in amplifier must be supplied for each "path" or channel within the device, and each lock-in amplifier must be set up for its respective measurement frequency and then allowed to reach equilibrium before useful data may then be taken.

The output of the lock-in amplifier is also dependent upon the phase difference between the signal to be measured and the reference driver. The reference driver defines the length of the time period of the fundamental frequency of the signal input.

The final section of the lock-in amplifier, namely the low pass filtering DC amplifier combination, follows the synchronous demodulation; it amplifies the DC component of the signal and attenuates the AC components of the signal. The attenuation is dependent upon the frequency of the input and reference signals. Thus, with a lock-in amplifier, device attenuation response will be skewed depending upon the frequency used to test the device.

SUMMARY OF THE INVENTION

The present invention is a device and method for direct digital detection by sampling of a signal to be measured which is synchronous with a reference frequency. The invention methods herein described are widely applicable to virtually any physical system where synchronous detection is required. The characteristics sought to be measured can be electromagnetic, mechanical, or optical, to name a few. Specifically treated here, however, will be the case of a mechanically driven optical chopper used to test a photoelectric sensor.

The present invention is computer controlled and solves many of the problems encountered when using lock-in amplifiers. The present invention requires no pre-filtering. This means that there are no filters to be switched in for different frequencies or measurements, and there will be no attenuation of the signal based upon a particular synchronization frequency. Such a system free of filters will avoid introduction of unwanted transfer functions to be "mixed in" with the transfer function of the device being measured.

The present invention also represents a reduction in bulk of required equipment as well as testing expense, especially the expenses of labor, since the time required for testing is reduced. The frequency of measurement can be adjusted without equipment substitution. The measurement time for testing and analysis is shorter than for a lock-in amplifier typically by factors of 10 to 100.

The present invention also incorporates the inherent statistical stability associated with large sample numbers without any danger of double counting or multiple inclusion of a recurring signal anomaly. Also, due to the sampling nature of the invention, data acquisition can occur immediately with less regard to computational speed of the system under use.

BRIEF DESCRIPTION OF THE DRAWINGS

The forgoing summary of the invention and other advantages of the invention will be described in more detail below taken in conjunction with the accompanying drawings of which.

DETAILED DESCRIPTION OF THE PREFERRED EMBODIMENT

Figure 1A:
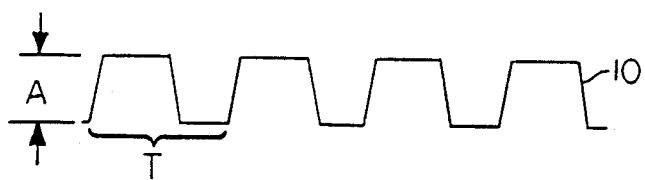
FIGS. 1a-1d are graphical representations of the inputs and outputs waveforms which may relate to a photo electric detector using the system and method of the present invention.
Figure 1B:

FIGS. 1a-1d illustrate a series of waveforms pertinent to the present invention. Waveform 10 of FIG. 1a is a somewhat trapezoidal, pure, undistorted waveform for inputting into a device to effect an output. Waveform 10 is considered to be a large signal waveform having large amplitude A. An output waveform 18 of FIG. 1b is the output from a device which was injected with waveform 10 as its input. Waveform 18 is also considered to be a large signal waveform, but it exhibits an amplitude a. Waveform 18 has the same frequency as waveform 10, but its amplitude is determined by the transfer function (response) of the device into which it was injected. Waveform 18 is also impressed with noise. This noise is common in electrical devices and impossible to completely remove from analog devices.

Figure 1C:
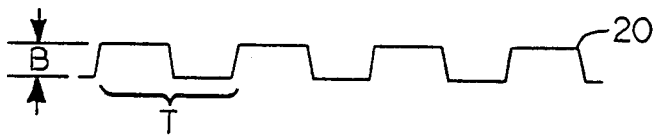
Figure 1D:

A waveform 20, illustrated in FIG. 1c is a small signal waveform having small amplitude B. An output waveform 22 of FIG. 1d is the output from a device which was injected with waveform 20 as its input. Waveform 22 is also considered to be a small signal waveform, and it exhibits an amplitude b. Waveform 22 has the same frequency as waveforms 10, 18 and 20, but its amplitude is so small that it is not discernible from the noise which envelopes it.

A square wave is a commonly used waveform due to its ease of generation using simple circuitry. All actual square waves are somewhat trapezoidal due to the inability of devices to instantly assume a different voltage level with no time actually spent in the transition. This is often referred to in electronics as the "slew rate." The series of waveforms of FIGS. 1a-1d can illustrate a mechanically driven optical system. The magnitude of the slew rate is even more severe in the case of a mechanically driven chopper since an optical sensor will have a finite area which will be differentially illuminated as the chopper passes, as will be later shown. Thus, input waveforms 10, 18 and 20 are slightly more trapezoidal than would be the case for a purely electronic system.

The portions of waveform 22 which were due to the operation of a transfer function of the device upon the waveform 20 exist within output waveform 22. Waveform 22 must be otherwise analyzed to withdraw those portions of waveform 22 present due to operation on waveform 20 by the device.

Figure 2:
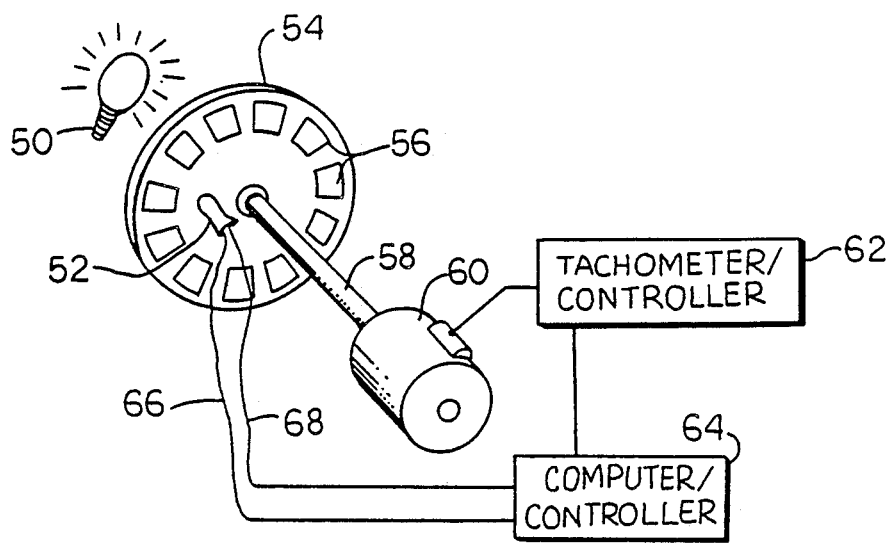
FIG. 2 is a mechanically driven chopper used to illuminate the photo electric sensor to produce the waveforms of FIGS. 1a-1d.

The apparatus and method of the present invention will be most thoroughly explained and illustrated using the mechanically driven chopper used to test a photoelectric sensor and is illustrated in FIG. 2. A light source 50 is situated in optical alignment with a photodetector 52. A chopper wheel 54 having apertures 56 of the proper shape circumferentially evenly spaced about chopper wheel 54 is positioned between light source 50 and photodetector 52. The axis of chopper wheel 54 is displaced from the axis of optical alignment between photodetector 52 and light source 50 to allow the apertures 56 to be rotatable into alignment with the axis of optical alignment between photodetector 52 and light source 50. Chopper wheel 54 is connected to and rotatably supported by a shaft 58. Shaft 58 is connected to and driven by motor 60.

A tachometer/control 62 is electrically connected to stepper motor 60. Tachometer/control 62 is electrically connected to a computer/controller 64. Photodetector 52 is electrically connected to leads 66 and 68. Leads 66 and 68 are also connected to computer/controller 64.

The operation of the apparatus of FIG. 2 follows. A suitable light source 50 of the proper intensity illuminates the region of the chopper wheel 54 apertures 56. A chopper wheel 54 having apertures 56 of the proper shape circumferentially evenly spaced about chopper wheel 54 spins at a specified speed which determines the frequency of illumination of photodetector 52. The light passes through apertures 56 intermittently exposing photodetector 52 to light from light source 50. Chopper wheel 54 is driven by motor 60 through shaft 58. Tachometer/control 62 provides the control necessary for motor 60 to spin chopper wheel 54 at the desired angular rate and to feedback the motor speed to a computer/controller 64. Output leads 66 and 68 are also connected to computer/controller 64.

Typically, the intensity of light from light source 50 can be controlled. The intensity of light source 50, after passing through chopper wheel apertures 56, is equivalent to the amplitude of wave form 10 shown on FIG. 1. Since the number and spacing of apertures 56 on chopper wheel 54 is known as well as the speed of motor 60, the computer/controller 64 can synchronize the signal received from output leads 66 and 68 of photodetector 52 with its "input" frequency.

The input small signal waveform 20 of FIG. 1c will be generated by the mechanically driven system. A rising and falling light intensity will constitute the input to photodetector 52. Output waveform 22 of FIG. 1d will then be produced in leads 66 and 68 from photodetector 52 of FIG. 2. Input waveform 20 will have a small amplitude such that the noisy output waveform 22 of FIG. 1d will be produced. The characteristics of waveform 22 due to input waveform 20 will consequently be quite difficult to detect due to its small magnitude relative to the noise level.

A small magnitude waveform 20 for an electronic system would usually be measured in root mean square (RMS) volts of the fundamental component of the waveform. Here, input waveform 20 will consist of a light source which is alternatively exposed and shielded from the presence of a photodetector 52. Photodetector 52 by means of leads 66 and 68 electrically transmits a signal indicative of the response to the amount of illumination photodetector 52 receives at any given time to computer/controller 64. Although the mechanics of the light source production are treated in great detail, the system of the present invention can be applied to many stimuli and their resulting output.

In the present case we are concerned with the small signal transfer function of photodetector 52. For a given level of input intensity, the level of the output intensity is to be determined. The input intensity is equivalent to the amplitude of waveform 22 of FIG. 1d. Of primary concern is the amplitude of the signal transmitted by photodetector 52 along leads 66 and 68. It is clear that the amplitude of the electric signal from photodetector 52 will be a function of the intensity of the light received from light source 50 through apertures 56 of chopper wheel 54. This function, the action of one system in response to an input, is often referred to as a transfer function. The amplitude of output waveform from photodetector 52 may or may not exhibit the mathematical consistency of an idealized transfer function. It is the linearity of this transfer function, through the small signal input, which is being tested by the apparatus and method of the present invention.

It is desirable to know the characteristic transfer function response to input signal strength for a given device. Once enough devices are tested, using the system and method of the present invention, and then perfected to discover the best characteristic transfer function attainable, the standards of response which a type of device is to meet are established. Once the standard is established, tests, again using the system and method of the present invention, can establish whether or not a particular device is within the established specification.

An explanation of the theory of the present invention begins with the observation that a periodic function can be represented by an infinite sum of sine and cosine functions that are harmonically related. The period of any trigonometric term in the infinite series is an integral multiple, or harmonic, of the fundamental period T of the periodic function. This is true, even for a square wave, even though the series would have to be calculated far into the higher frequency harmonics to fill out the square. We may thus write the Fourier series as follows:

$$V(t) = A_o + \sum_{j=1}^{\text{infinity}} A_j \sin \frac{2\pi j t}{T} + B_j \cos \frac{2\pi j t}{T} \quad (1)$$

where j is an integer sequence 1, 2, 3, 4, etc. However, since we will specify that the signal has no direct current component, we will omit the $A_o$ term relating to that component. T is the signal period and t is time. The traditional Fourier definitions of $A_j$ and $B_j$ are:

$$A_j = \frac{2}{T} \int_0^T V(t) \sin \frac{2\pi j t}{T} \quad (2)$$

and $$B_j = \frac{2}{T} \int_0^T V(t) \cos \frac{2\pi j t}{T}$$

The subscript j is again used to indicate the jth coefficient in the integer sequence 1, 2, 3, 4, etc. So, each $A_j$ and $B_j$ is dependent on the integer number of the harmonic being measured. So a repetitive waveform, even a square wave, can be thought of as being composed of all the harmonics of a Fourier series from 1 to infinity. $A_1$ and $B_1$ are the amplitudes of the quadrature constituents of the fundamental component, which has a period T. This treatment of the fundamental frequency, isolated from treatment of the higher harmonics of the fundamental frequency, permits the determination of the transfer function as a function of frequency. Since the fundamental frequency having a period T is controlled by synchronization, we can examine any higher frequency desired by increasing the speed and causing the higher frequency to become the fundamental frequency. Therefore, the effects of frequency upon the transfer function can be examined individually, without the error producing contribution from the presence of higher harmonic frequencies.

First, it is to be noted that the input waveform 20 of FIG. 1c is a constant repetitive waveform. It can be thought of as a series of positive and negative step functions. In this discussion we assume that the photodetector 52 transfer function is constant in time; therefore, a repetitive input yields a repetitive output.

The brief time span of a single fundamental period will not permit accurate measurement of waveform 22 of FIG. 1d. Also, even if possible, integrating over one period would not allow enough data points to be gathered to be statistically rid of the noise. In addition, data points gathered over one period do not have the smoothing "randomness" of data taken over several periods. The method to be discussed applies sampling techniques to determine the amplitude (or RMS) of the fundamental component in the output signal of a device, say photodetector 52. The phase of the output is also obtained. The method yields values of $A_1$ and $B_1$, defined above.

An ideal sampling system would use samples at intervals distributed randomly, with a mean interval smaller than one-half the fundamental period T. The exact time for each sample must be known, and the sample set must be large. Computation using such a scheme would be extremely cumbersome. Another scheme proposed involves periodic sampling at a rate which is an exact multiple of the fundamental frequency. This yields an exactly integer number of samples each period, T. These samples always occur at the same positions in the waveform. This approach ameliorates the computational problem, but produces a severe aliasing problem. The approach discussed here uses pseudorandom sampling which is periodic, with a period such that an exactly integer number of samples is obtained for an integer number of fundamental periods; but this integer number of periods is large. More than two samples occur per period T. This permits ready computation of $A_1$ and $B_1$ without the aliasing penalty.

The apparatus and method of the present invention exploit the benefits of sampling and avoid the detrimental effects of periodic sampling by means of a pseudorandom sampling technique. Exactly N samples will be taken during exactly M fundamental periods of signal reception from photodetector 52, where M and N are odd integers having no common factors. In this manner, a sample will never be taken more than once from a particular position in the period during M periods.

For a more in depth treatment of the consideration of how sampling applies to the apparatus and method of the present invention, consider the input wave form 20 of FIG. 1c. This signal will have period T. The input signal, having a length of many periods T, is to be sampled at a periodic rate having a period $t_s$. The time $t_s$ must be chosen to be compatible with the Nyquist sampling theorem which states that the signal period T should be greater than, and preferably much greater than, twice the time between the periodic sample rate period $t_s$, namely:

$$T >>> 2t_s. \qquad (3)$$

The choice of these two rates is quite important to the best accuracy obtainable with the system of the present invention. Integers M and N are chosen such that:

$$M \times T = N \times t_s. \qquad (4)$$

Preferably M and N will be chosen to be much greater than unity. The above relation indicates that exactly N samples will be taken during exactly M cycles of the signal and, if the sampling continues uninterrupted, blocks of N samples will continue to be taken every M cycles of the fundamental signal. If the integer numbers N and M have no common factors, the sample N will not be taken during the same time within any two signal periods T of the M cycles of the signal.

For example, if N were improperly selected to be 4 and M were improperly selected to be 2, it is clear that a sample would be taken in the middle and the end of the first period T and again at the middle and the end of the second period T. The sample would have no "seeming randomness" and would, for a fixed number of samples, give a much narrower sampling coverage over the produced wave form. The easiest way to select M and N to avoid this effect would be to refer to a prime number table. By definition, a prime number has no common factors with any other prime number.

If the signal-to-noise ratio obtained by integrating over M cycles produces too low a signal-to-noise ratio, a new signal value can be obtained by taking data in several blocks which are M cycles long, perform the convolution for each of the blocks, and then averaging the results. The integration is performed numerically.

We prove two theorems required to understand the data acquisition. Theorem 1: For a noiseless, periodic waveform, taking exactly N samples over exactly M cycles is equivalent to taking N uniformly distributed samples over one cycle. In the following we prove the theorem for one term in the Fourier series expansion; the extension to all terms is apparent. Therefore, consider the jth term of the sine portion of the expansion. For the case of N samples over M cycles, the nth sample is:

$$A_j \sin(2\pi j n t_s/T) \quad n=0,1,2,\ldots N-1 \qquad (5)$$

where $t_s$ is the time between samples. We have from equation 4 $M \times T = N \times t_s$, and combining with equation (5) yields:

$$A_j \sin(2j\pi nM/N) \qquad (6)$$

I define the operator Int(A) as yielding the largest integer less than or equal to A. (6) becomes:

$$A \sin(2\pi j/N)[nM - N\ \text{Int}(nM/N)] \qquad (7)$$

where the Int operator merely insures that the argument of the sine does not exceed $2\pi j$ radians. The n'th term for the case of N samples uniformly distributed over one cycle is:

$$A_j \sin(2\pi n'/N) \qquad (8)$$

Let $/D/$ be the set of elements generated by the function D. Then, we must show that the two sets of elements:

$$S_1 = /nM - N\ \text{Int}(nM/N)/ \qquad (9)$$

$$S_2 = /n'/ \qquad (10)$$

are identical, because if they are, the arguments of (6) and (8) go through the same values. Further, since the reference waveforms go through the same values, they will correspond appropriately. The proof will show that if, independent of N-value, there is one M value, say M', for which the thesis is valid, then it is valid for M' + 1. From this it follows that the thesis is true for all M greater than or equal to M'. Since the thesis, by definition, is true for M = 1, it is true for all M.

Since we take the thesis true for M = M', there exists a set of integers $k_n$ such that $n' = n + k_n$, and $$n + k_n = nM' - N\ \text{Int}(nM'/N) \qquad (11)$$

Now we show how to find a new set of integers $K_n$, for $M = M' + 1$.

$$n + K_n = n(M' + 1) - N\ \text{Int}(n(M' + 1)/N) \qquad (12)$$
$$= nM' + n - N\ \text{Int}(n/M'N + n/N) \qquad (13)$$

Note that:

$$\text{Int}(A+B) = \text{Int}(A) + \text{Int}(B) + \text{Int}(A+B-\text{Int}(A)-\text{Int}(B)) \qquad (14)$$

and Int(n/N) = 0. Therefore:

$$\text{Int}(nM'/N + n/N) = \text{Int}(nM'/N) + \text{Int}(nM'/N + n/N - \text{Int}(nM'/N)) \qquad (15)$$

and;

$$n + K_n = nM' + n - N\,Int(nM'/N) - \qquad (16)$$
$$N\,Int(nM'/N + n/N - Int(nM'/N))$$
$$= 2n + k_n - N\,Int(nM'/N + n/N - Int(nM/N)).$$

Therefore:

$$K_n = n + k_n - N\,Int(nM'/N + n/N - Int(nM'/N)) \qquad (17)$$

Thus, for each $k_n$ there is a unique $K_n$. We see that:

$$Int(nM'/N + n/N - Int(nM'/N)) = 0 \text{ or } 1 \qquad (18)$$

and thus;

$$K_n = n + k_n, \text{ or } n + k_n - N. \qquad (19)$$

Thus, we have shown that if the thesis is true for $M = M'$, then it is true for $M = M' + 1$, independent of N-value, that the relationship is unique, that the numbers of elements in the two sets $S_1$ and $S_2$ are identical, that the thesis is true for $M = 1$, and therefore the thesis is true in general.

Figure 3A:
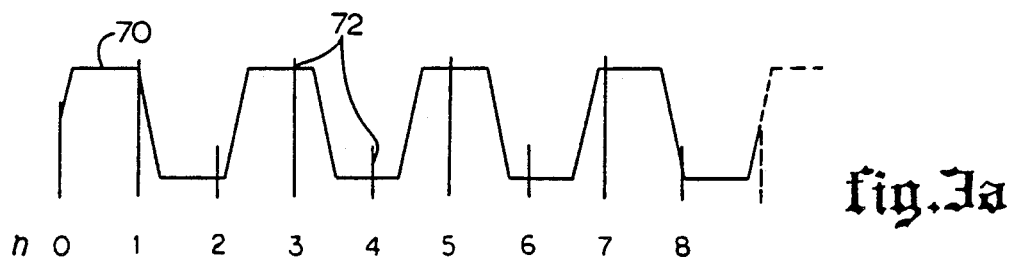
FIGS. 3a-3b are diagrammatic illustrations of an example of the application of the sampling theorem.
Figure 3B:
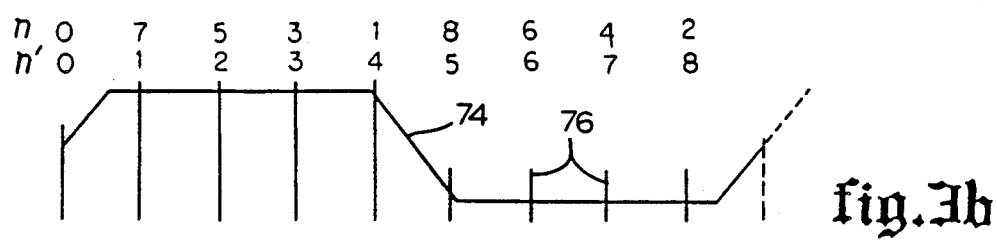

FIGS. 3a and 3b illustrate a practical example of the application of this theorem for $M = 4$, $N = 9$. The upper FIG. 3a shows the positions of the samples of set $S_1$. The lower FIG. 3b shows the positions of the samples of set $S_2$. The values of n and n' are shown. The dashed portions corresponds to the next sets of cycles and samples. 70 is an idealized waveform, with samples taken at the tick marks, two of which are identified as 72. Below the tick marks are the labels, n, in sequence for the samples. 74 is one cycle of the same idealized waveform with the abscissa expanded four times. The equivalent sample points are again shown as tick marks, two of which are identified as 76. The set n' is shown, and above it is the corresponding set n.

Therorem 2

$$\sum_{i=0}^{p-1} \sin(2\pi ip)\sin(2\,in/p) = \sum_{i=0}^{p-1} \sin(2\pi i/p)\cos(2\pi in/p) = \qquad (20)$$

$$\sum_{i=0}^{p-1} \cos(2\pi ip)\sin(2\,in/p) = \sum_{i=0}^{p-1} \cos(2\pi i/p)\cos(2\pi in/p) =$$

0 for $p, n$ integer 1

The proof makes use of the Dirac delta $\delta(a)$, where: $\int_\Delta f(x)\,\delta(a)\,dx = f(a)$, where the region of integration $\Delta$, covers a. Consider the first term to be shown zero. The proofs for the other terms are similar and will not be given here.

$$\sum_{i=0}^{p-1} \sin(2\pi ip)\sin(2\pi in/p) = \qquad (21)$$

$$\int_0^1 \sin(2\pi x)\sin(2\pi nx) \sum_{i=0}^{p-1} \delta(x - i/p)\,dx$$

This may be integrated by parts;

$$dv = \Sigma\delta(x - i/p)dx; \text{ thus } v = p, \text{ and } u = \sin(2\pi x)\sin(2\pi nx) \qquad (22)$$

We find:

$$\sum_{i=0}^{p-1} \sin(2\pi ip)\sin(2\pi in/p) = p\,\sin(2\pi x)\sin(2\pi nx)\Big|_0^1 - \qquad (23)$$

$$p \int_0^1 [2\cos(2\pi x)\sin(2\pi nx) + 2\pi n\,\sin(2\pi x)\cos(2\pi nx)]dx$$

Each of the terms on the right side of equation (18) is zero. Therefore;

$$\sum_{i=0}^{p-1} \sin(2\pi ip)\sin(2\pi in/p) = 0,$$

which was to be proven.

The received signal expressed as a Fourier series is:

$$V(t) = \sum_{i=0}^{N-1} A_i \sin(2\pi it/T) + B_i \cos(2\pi it/T)^1 \qquad (24)$$

We take samples of $V(t)$ at the times $nt_s$ where n goes from 0 to $N-1$. Let each of these samples be $V_n$. Consider the sums:

$$S = \sum_{n=0}^{N-1} V_n \sin(2\pi nt_s/T) \qquad (25)$$

and $$C = \sum_{n=0}^{N-1} V_n \cos(2\pi nt_s/T)$$

Each of the $V_n$ consists of contributions from the terms in the Fourier expansion, equation (19). By Theorem 2, all the contributions to the sums S and C are zero, except for those of the fundamental. By Theorem 1 we may, for computation, use the equivalent samples distributed over one cycle of the fundamental. Thus, $$S = \sum_{n'=0}^{N-1} V_n \sin(2\pi n'/N) \qquad (26)$$

and $$C = \sum_{n'=0}^{N-1} V_n \cos(2\pi n'/N)$$

and $$S = \sum_{n'=0}^{N-1} A_1 \sin^2(2\pi n'/N) \qquad (27)$$

and $$C = \sum_{n'=0}^{N-1} B_1 \cos^2(2\pi n'/N)$$

We have used n' as the set over one cycle, as in equation 4. Therefore, $$A_1 = S / \left( \sum_{n'=0}^{N-1} \sin^2(2\pi n'/N) \right) \qquad (28)$$

and

-continued $$B_1 = C / \left( \sum_{n'=0}^{N-1} \cos^2(2\pi n'/N) \right)$$

Theorem 1, in addition to providing more insight, permits more precise calculation of the sums appearing in equation (28). Thus the procedure is as follows: select M and N, compute the set /n'/, compute the sine and cosine terms in equation (26) and store them as a lookup table or equivalent, and compute the sums in the denominators of equation (28). Take the samples Vn of the received signal and multiply each sample by its appropriate sine and cosine terms to obtain the sums S and C as in equation (26). From these compute A1 and B1 using equation (28). The amplitude of the signal is:

$$I = \sqrt{A_1^2 + B_1^2} \qquad (29)$$

Note that these results, particularly Theorem 2, imply that there is no aliasing of higher order harmonics into $A_1$ and $B_1$. Therefore, prefiltering for the purpose of eliminating them is not required, and the technique may be applied without any tuned element in the signal detection and acquisition chain. Both N and M should be chosen large to approximate random sampling, and N should be greater than twice M. Further, they should have no common factors. We also note that since the process permits determination of both $A_1$ and $B_1$, the counting sequence is not required to start at a particular n, or n' value; the requirement is that N sequential samples be taken, and that the n' and n values correspond as determined by the process resulting from Theorem 1.

Both sine and cosine terms are taken to account in the above equations in the event of a "phase lag" between the occurrence of a period T at the optical sensor 12 and the measurement of a sample V(t) by computer/controller 64, of FIG. 2. The resulting $A_1$ and $B_1$ are then squared, summed, and square rooted to obtain the true amplitude of the low amplitude output waveform 22 or the high amplitude output waveform 18 of FIGS. 1d and 1b respectively.

If the signal-to-noise ratio obtained by integrating over M cycles is too poor, a greater signal-to-noise value can be obtained by taking data in blocks which are M cycles long, perform the computation for each of the blocks, and then average the results. The computation is performed numerically.

The computer can be programmed to control the testing process. Various amplitude data can be calculated for different irradiances from light source 50 and different synchronous rates. The computer can control and perform these various tests, compile the data, and then generate plots of gain, transfer function or frequency response.

Figure 4:
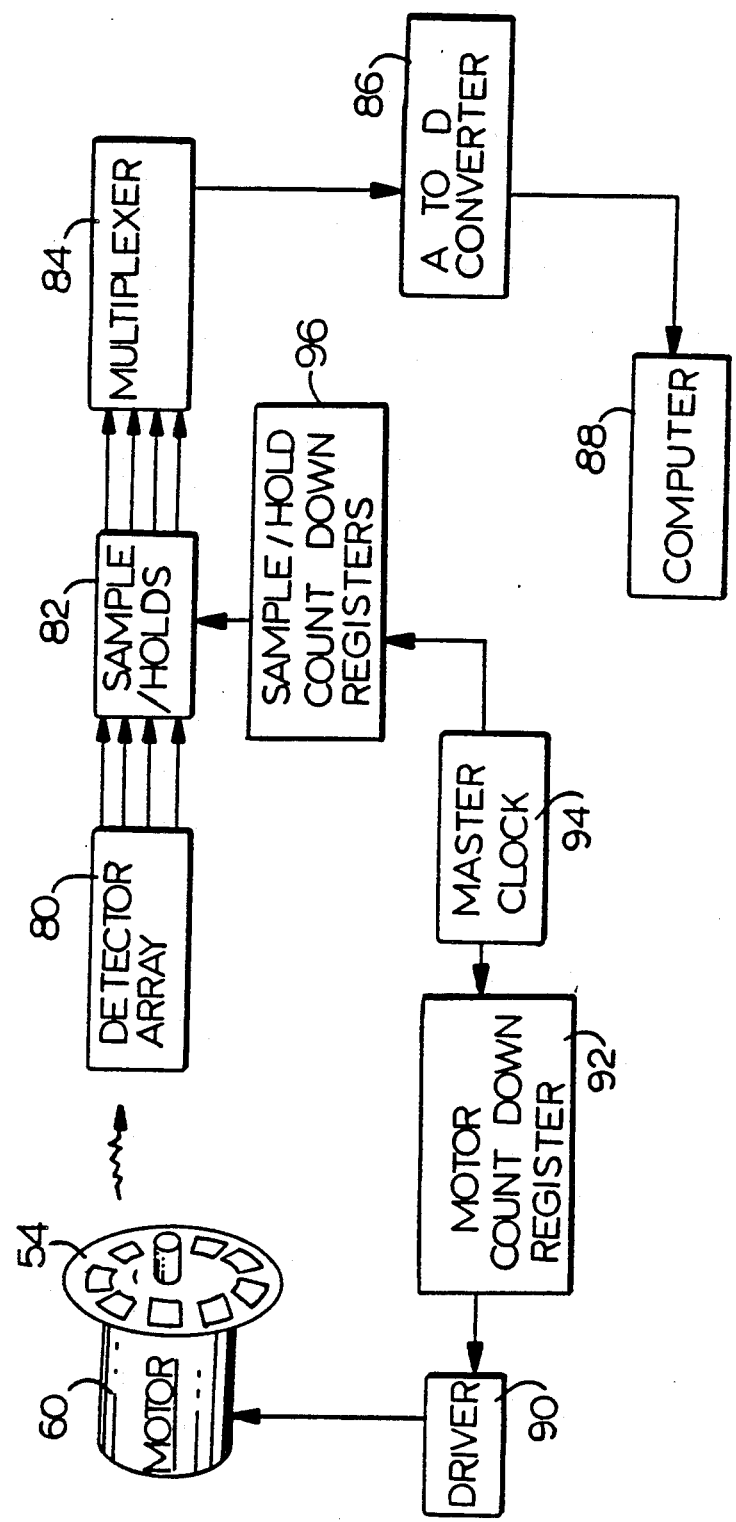
FIG. 4 is a block diagram schematic of the system of the present invention utilizing mechanical means for production of the waveforms of FIGS. 1a-1d.

FIG. 4 is a block diagram schematic of a mechanically operated system of the present invention. Motor 60 and chopper wheel 54 are the same as those appearing in FIG. 2. In FIG. 4, light passes through chopper wheel 54 to a detector array 80. Detector array 80 is multiply electrically connected to a sample and hold 82. Sample and hold 82 is multiply electrically connected to a multiplexer 84. Multiplexer 84 is connected to an analog to digital converter 86. Analog to digital converter 86 is electrically connected to a computer 88.

Motor 60 is controllably electrically connected to a driver 90. Driver 90 is controllably electrically connected to a motor countdown register 92. Motor countdown register 92 is electrically connected to a master clock 94. Master clock 94 is electrically connected to a set of sample and hold countdown registers 96. Sample and hold countdown registers 96 are connected to the sample and holds 82.

Detector array 80 functions similarly to photodetector 52 of FIG. 2 but will ideally be more sophisticated and capable of greater accuracy. Having a number, or array, of detectors such as detector array 80 will facilitate the taking of large numbers of samples. Sample and holds 82 will take and hold the photoelectric voltage levels of the detector array 80 upon command from sample and hold countdown registers 96. Sample and hold countdown registers 96 receive their timing instructions from master clock 94. Master clock 94 also gives timing instructions to motor countdown registers 92. Motor countdown registers 92 provide control to driver 90, which in turn drives and determines the speed of motor 60.

Sample and holds 82 are electrically multiplexed by multiplexer 84. Multiplexer 84 selectively provides the voltage potentials held by sample and holds 82 to the analog to digital converter 86. Analog to digital converter 86 provides digital representations of the voltages of the sample and holds 82 to the computer 88. Computer 88 stores the digital representations of the voltages from sample and holds 82 for computation. Computer 88 recalls the voltage information and performs the numerical integration in accord with the above disclosure. The result is the signal amplitudes from a photodetector array. If the flux density of light reaching the detector array 80 is known by computer 88, the transfer function at that flux density can also be computed. If computer 80 is also made to control the intensity of light reaching detector array 80, the computer can step through a series of samples and compute the transfer function for the detector array 80 as a function of light intensity.

Figure 5:
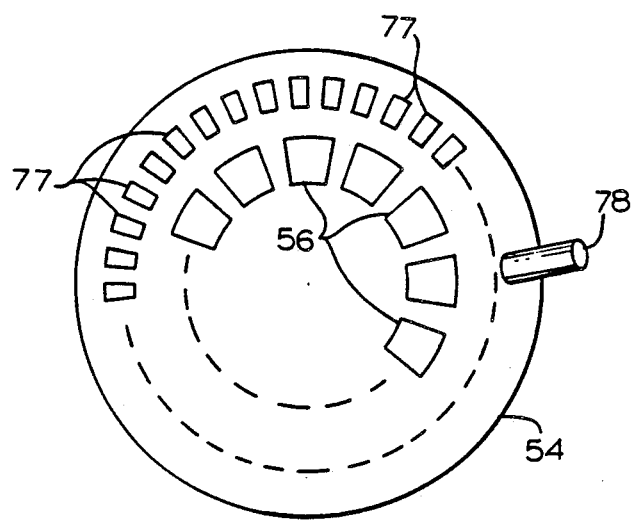
FIG. 5 is a chopper wheel having two sets of apertures.

An example of an implementation not requiring a master clock 94 incorporates a chopper wheel with two sets of apertures. In addition to the apertures 56 of chopper wheel 54 in FIG. 2, the chopper wheel shown in FIG. 5 is provided with a second set of N equally spaced apertures labeled 77, while the number of apertures in the set 56 is made equal to M. An optical switch set, 78, comprising an LED/detector combination, is aligned with apertures 77 and provides N pulses for M cycles of the fundamental stimulus resulting from apertures 56. These N pulses are then used as the trigger for the sample-and-holds 82. Processing from then on proceeds unchanged from the sequence described for FIG. 4.

Figure 6:
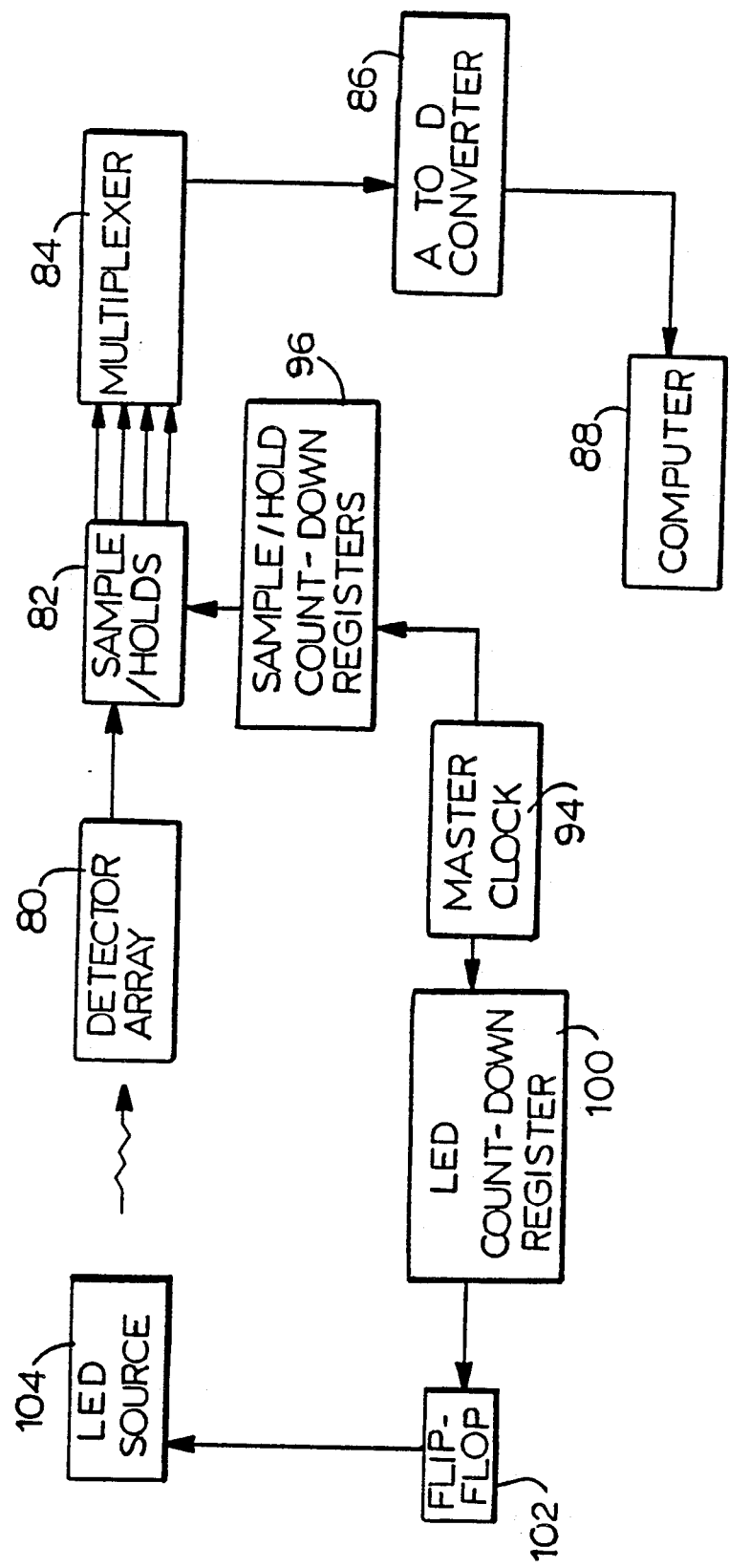
FIG. 6 is a block diagram schematic of the system of the present invention utilizing electronic means for production of the waveforms of FIGS. 1a-1d.

FIG. 6 is similar in most respects to FIG. 4. However, motor countdown registers 92 have been replaced by LED (light emitting diode) countdown registers 100. LED countdown registers 100 are connected to master clock 94, as in FIG. 4. Driver 90 of FIG. 4 is replaced by a flip flop 102 in FIG. 6. Flip flop 102 is electrically connected to LED countdown register 100. Motor 60 of FIG. 4 is replaced by a LED source 104.

In FIG. 6, the master clock 94 supplies timing information to sample and hold countdown registers 96 as previously described for FIG. 5. Master clock 94 also supplies timing information to LED countdown register 100. LED countdown register 100 activates flip flop 102. Flip flop 102 activates LED source 104. LED source 104 supplies periodic illumination to detector array 80 in the same manner as was mechanically performed in FIG. 5. Detector array 80 then supplies a photoelectrically produced voltage to sample and holds 82 in the same manner as described for the apparatus of FIG. 5.

The foregoing disclosure and description of the invention are illustrative and explanatory thereof and various changes in the type sensor being tested or the form of inputs and outputs being measured, as well as in the details of the illustrated construction, may be made without departing from the spirit of the invention.

I claim:

1. A digital detector comprising:
   means for producing a periodic signal of a known frequency;
   means responsive to said periodic signal, for producing an output signal;
   control means for periodically sampling said output signal at a known rate synchronously and pseudo-randomly such that the ratio of the sample rate to signal frequency, when reduced to lowest terms, is the ratio of large whole numbers;
   means to convert the samples to digital values; and,
   means for calculating weighted sums of these values to result in the computation of the sine and cosine Fourier components of said output signal, to yield the magnitude of said output signal.

2. The digital detector of claim 1 wherein said means for producing a periodic signal comprises;
   an electrically driven motor having a rotatable shaft;
   a relatively flat chopper wheel having a series of apertures circumferentially evenly spaced about the axis, said chopper wheel rotatably connected to and driven by said shaft; and
   a first source of light aligned with said means responsive to said periodic signal and intermittently allignable with each of said series of apertures as said chopper wheel rotates.

3. The digital detector of claim 2 further comprising:
   an optical switch connected to said control means, and wherein said chopper wheel has a second series of apertures, evenly spaced about the axis of said chopper wheel, said optical switch aligned with said first source of light and intermittently allignable with each of said second series of apertures as said chopper wheel rotates.

4. The digital detector of claim 1 wherein said control means for periodically sampling said output signal is a computer.

5. A digital detector comprising:
   means for producing a periodic signal wherein said means for producing a periodic signal comprises:
   a light emitting diode (LED) light source;
   timing circuitry controllably connected to said light emitting diode light source
   means responsive to said periodic signal, for producing an output signal; and
   control means for periodically sampling said output signal and performing a numerical integration to compute the sine and cosine Fourier coefficient of the fundamental harmonic of said output signal.

6. A digital detector comprising;
   means for producing a periodic signal, wherein said means for producing a periodic signal comprises:
   an electrically driven motor having a rotatable shaft;
   a relatively flat chopper wheel having a series of apertures circumferentially evenly spaced about the axis, said chopper wheel rotatably connected to and driven by said shaft;
   a first source of light aligned with said means responsive to said periodic signal and intermittently allignable with each of said series of apertures as said chopper wheel rotates;
   means responsive to said periodic signal, for producing an output signal; control means for periodically sampling said output signal and performing a numerical integration to compute the sine and cosine Fourier coefficient of the fundamental harmonic of said output signal; and,
   an optical switch connected to said control means, and wherein said chopper wheel has a second series of apertures, evenly spaced about the axis of said chopper wheel, said optical switch aligned with said first source of light and intermittently allignable with each of said second series of apertures as said chopper wheel rotates, and wherein the number of apertures of said second series of apertures is at least twice the number of said first series of apertures, and where there is no common factor in the numbers of said first series of apertures and in the numbers of said second series of apertures.

7. A digital signal detector comprising:
   a master clock;
   a motor countdown register electrically connected to said master clock;
   a motor driver electrically connected to said motor countdown register;
   a motor electrically connected to said motor driver;
   a chopper wheel having a series of circumferentially evenly spaced apertures, and rotatably supported and powered by said motor;
   a source of light associated with the path of rotation of said chopper wheel and so aligned with said apertures to permit light to intermittently pass through said apertures as said chopper wheel turns;
   a multiplicity of sample and holds, for receiving photoelectrically induced voltage signals;
   a multiplicity of sample and hold countdown registers electrically controlled by said master clock and electrically connected to said multiplicity of sample and holds;
   a multiplexer connected to said multiplicity of sample and holds;
   an analog to digital converter connected to said multiplexer; and,
   a computer connected to said analog to digital converter.

8. The digital detector of claim 7 further comprising a photoelectric detector in optical alignment with said apertures of said chopper wheel and said source of light, said digital detector electrically connected to said multiplicity of said sample and holds, said digital detector to transmit photoelectrically induced voltage signals to said multiplicity of said sample and holds.

9. A digital signal detector comprising:
   a master clock;
   a light emitting diode countdown register electrically connected to said master clock;
   a flip flop electrically connected to said light emitting diode countdown register;
   a light emitting diode source of light connected to said flip flop;
   a multiplicity of sample and holds, for receiving photoelectrically induced voltage signals;

a multiplicity of sample and hold countdown registers electrically controlled by said master clock, and electrically connected to said multiplicity of sample and holds;

a multiplexer connected to said multiplicity of sample and holds;

an analog to digital converter connected to said multiplexer; and, a computer connected to said analog to digital converter.

10. The digital detector of claim 9 further comprising a photoelectric detector in optical alignment with said light emitting diode source of light, said digital detector electrically connected to said multiplicity of said sample and holds, said digital detector to transmit photoelectrically induced voltage signals to said multiplicity of said sample and holds.

11. The process of synchronously measuring the output of a device, comprising the steps of:

transmitting timing information from a master clock to a countdown register;

periodically transmitting a drive signal from said countdown register to a stimuli transmitter to indicate that the time for a stimuli has arrived;

transmitting the stimuli;

periodically transmitting a sample signal from said countdown register, at the same time said drive signal is transmitted, to a sampler to indicate that the time for sampling an input resulting from a transmitted stimuli has arrived;

sampling and holding said input N times during M cycles wherein M and N are integer prime numbers; p1 converting said sampled and held outputs from analog to digital form;

multiplying the product of each output sample by the sine of $2n'/N$ and the cosine of $2n'/N$ according to the following equations, $$S = \sum_{n=0}^{N-1} V_n \sin(2\pi n t_s/T)$$

and $$C = \sum_{n=0}^{N-1} V_n \cos(2\pi n t_s/T);$$

computing the sums of the squares of the sine of $2n'/N$ and cosine of $2n'/n$;

computing $A_1$ and $B_1$, the Fourier coefficients, according to the following equations, $$A_1 = S / \left( \sum_{n'=0}^{N-1} \sin^2(2n'/N) \right)$$

and $$B_1 = C / \left( \sum_{n'=0}^{N-1} \cos^2(2n'/N) \right)$$

computing the amplitude of the response to the fundamental components of the input by taking the square root of the sum of the squares of the Fourier coefficients $A_1$ and $B_1$ according to the following equation, $$I = \sqrt{A_1^2 + B_1^2}.$$

* * * * *